US012696388B2

(12) United States Patent
Zhang et al.

(10) Patent No.: US 12,696,388 B2
(45) Date of Patent: Jul. 28, 2026

(54) PRINTED CIRCUIT BOARD, MAINTENANCE METHOD THEREFOR, AND DISPLAY APPARATUS

(71) Applicants:Chongqing BOE Electronic Technology Co., Ltd., Chongqing (CN); BOE Technology Group Co., Ltd., Beijing (CN)

(72) Inventors: Jie Zhang, Beijing (CN); Guangchao He, Beijing (CN); Qining Mao, Beijing (CN); Tian Feng, Beijing (CN); Yuhao Tong, Beijing (CN); Haihai Xie, Beijing (CN); Zhicheng Fan, Beijing (CN)

(73) Assignees: Chongqing BOE Electronic Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 222 days.

(21) Appl. No.: 18/703,702

(22) PCT Filed: Oct. 29, 2021

(86) PCT No.: PCT/CN2021/127635
§ 371 (c)(1),
(2) Date: Apr. 22, 2024

(87) PCT Pub. No.: WO2023/070580
PCT Pub. Date: May 4, 2023

(65) Prior Publication Data
US 2024/0422904 A1　　Dec. 19, 2024

(51) Int. Cl.
H05K 1/18　　　　(2026.01)
H05K 1/11　　　　(2006.01)
(Continued)

(52) U.S. Cl.
CPC ............. *H05K 1/111* (2013.01); *H05K 1/181* (2013.01); *H05K 3/225* (2013.01); *H05K 3/3426* (2013.01);
(Continued)

(58) Field of Classification Search
CPC ........ H05K 1/111; H05K 1/181; H05K 3/225; H05K 3/3426; H05K 2201/09381; H05K 2201/10757
(Continued)

(56) References Cited

U.S. PATENT DOCUMENTS 5,471,368 A * 11/1995 Downie ................. H05K 3/403
361/767
6,340,797 B1 * 1/2002 Yoshida ................. H05K 1/112
174/260

FOREIGN PATENT DOCUMENTS

CN　　　201315702 Y　　9/2009
CN　　　102943268 A　　2/2013
(Continued)

OTHER PUBLICATIONS

Electronic Enthusiast Network "Remedial methods for solder pad detachment" [online] [retrieved on Jan. 12, 2022], https://www.elecfans.com/yuanqijian/PCB/20180226639780.html, Feb. 26, 2018, totally 4 pages with English translation.
(Continued)

*Primary Examiner* — Binh B Tran
(74) *Attorney, Agent, or Firm* — IPro, PLLC

(57) ABSTRACT
In the printed circuit board, normal pads that are not peeled off or damaged are first pads, Each first pad and a wire connected to the first pad have an integrated structure and are directly formed on a substrate. After a pad at a position on the substrate is peeled off, a second pad can be provided at the position, so as to replace the pad that was peeled off.
(Continued)

The second pad comes into contact with the wire and is fixed to the wire by solder. The first pin of a component is lapped with the first pad and is fixed with the first pad by solder. The second pin of the component is lapped with the second pad and is fixed with the second pad by solder.

19 Claims, 4 Drawing Sheets

(51) Int. Cl.
    *H05K 1/181*        (2026.01)
    *H05K 3/22*         (2006.01)
    *H05K 3/341*      (2026.01)
(52) U.S. Cl.
    CPC .............. *H05K 2201/09381* (2013.01); *H05K 2201/10757* (2013.01)

(58) Field of Classification Search
    USPC ......................................................... 361/767
    See application file for complete search history.

(56)                References Cited

FOREIGN PATENT DOCUMENTS

| | | | |
|---|---|---|---|
| CN | 107249258 | A | 10/2017 |
| CN | 108029199 | A | 5/2018 |
| CN | 107123718 | B | 3/2019 |
| CN | 111836479 | A | 10/2020 |
| CN | 113115523 | A | 7/2021 |
| JP | 2007180255 | A | 7/2007 |

OTHER PUBLICATIONS

PCT/CN2021/127635 international search report dated Feb. 21, 2022.

\* cited by examiner

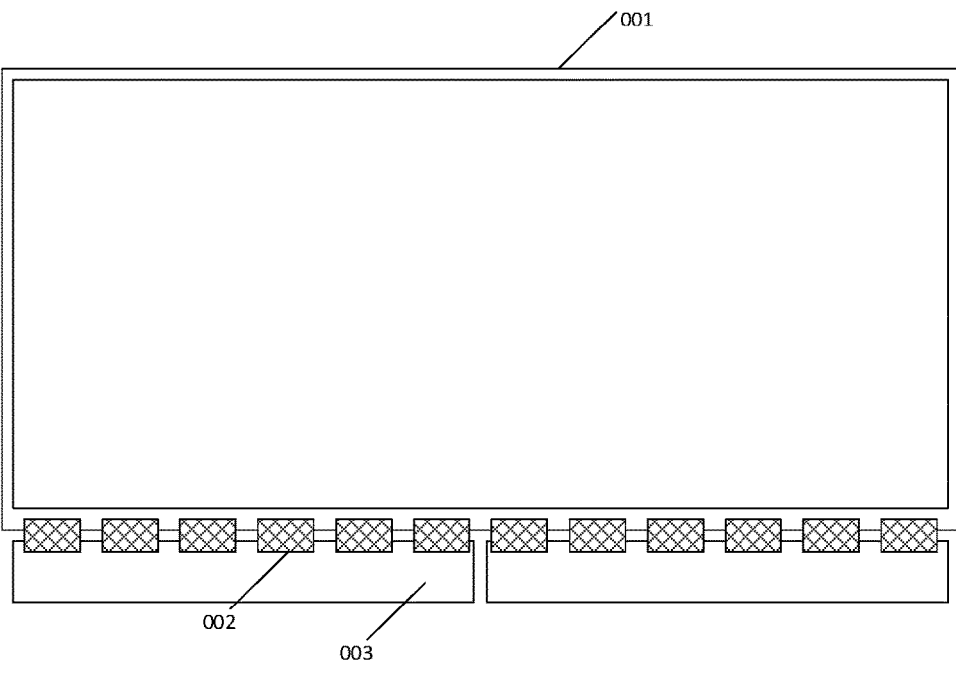

FIG. 6

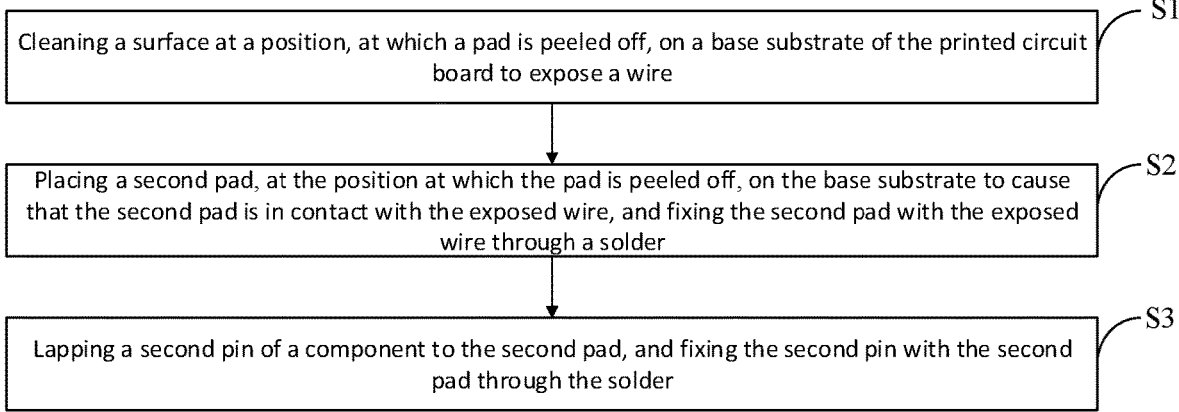

S1
Cleaning a surface at a position, at which a pad is peeled off, on a base substrate of the printed circuit board to expose a wire S2
Placing a second pad, at the position at which the pad is peeled off, on the base substrate to cause that the second pad is in contact with the exposed wire, and fixing the second pad with the exposed wire through a solder S3
Lapping a second pin of a component to the second pad, and fixing the second pin with the second pad through the solder

FIG. 7

PRINTED CIRCUIT BOARD, MAINTENANCE METHOD THEREFOR, AND DISPLAY APPARATUS

CROSS REFERENCE TO RELATED APPLICATION

The present disclosure is a National Stage of International Application No. PCT/CN2021/127635, filed Oct. 29, 2021, the entire contents of which are incorporated herein by reference.

TECHNICAL FIELD

The present disclosure relates to the technical field of display, in particular to a printed circuit board, a maintenance method therefor and a display apparatus.

BACKGROUND

In the display panel industry, printed circuit boards (PCB) are the main raw materials for production. During the processes of production, transportation, and transfer, components on the PCBs may fall off, and in serious cases, the pads of components may be peeled off, which causes the product to be scrapped because the pads are peeled off and cannot be repaired.

SUMMARY

The present disclosure provides a printed circuit board, a maintenance method therefor and a display apparatus, which are used to solve the problem of high maintenance cost for PCB pads peeling off.

A printed circuit board provided by embodiments of the present disclosure includes:

a base substrate;

a plurality of wires and a plurality of pads, located on one side of the base substrate, wherein the plurality of pads are correspondingly connected with the plurality of wires, the plurality of pads include a first pad and a second pad, the first pad and a wire connected with the first pad are integrated, and the second pad is in contact with a wire connected with the second pad and is fixed with the wire connected with the second pad through solder; and at least one component, located on one side of the plurality of pads away from the base substrate and including pins, wherein the pins include a first pin and a second pin, the first pin is lapped with the first pad and is fixed with the first pad through solder, and the second pin is lapped with the second pad and is fixed with the second pad through solder.

In a possible implementation, in the printed circuit board provided by the embodiments of the present disclosure, the first pin and the second pin belong to one component.

In a possible implementation, in the printed circuit board provided by the embodiments of the present disclosure, the component includes a plurality of pins, and a quantity of first pins included in one component is greater than a quantity of second pins included in the one component.

In a possible implementation, in the printed circuit board provided by the embodiments of the present disclosure, the second pad includes a wire connection portion and a pin connection portion connected with each other. The wire connection portion is arranged in contact with the wire, the pin connection portion is arranged in contact with the second pin, and an appearance of an orthographic projection of the wire connection portion on the base substrate is different from an appearance of an orthographic projection of the pin connection portion on the base substrate.

In a possible implementation, in the printed circuit board provided by the embodiments of the present disclosure, an area of the orthographic projection of the pin connection portion on the base substrate is larger than an area of the orthographic projection of the wire connection portion on the base substrate.

In a possible implementation, in the printed circuit board provided by the embodiments of the present disclosure, the orthographic projection of the pin connection portion on the base substrate has a first width in a direction perpendicular to the connection line from the second pin to the wire, the orthographic projection of the wire connection portion on the base substrate has a second width in the direct perpendicular to the connection line from the second pin to the wire, and an orthographic projection of the second pin on the base substrate has a third width in the direction perpendicular to the connection line from the second pin to the wire; and the first width is greater than the second width, and the first width is greater than the third width.

In a possible implementation, in the printed circuit board provided by the embodiments of the present disclosure, the second pad has a length in a direction of a connection line from the second pin to the wire, the second pad is divided at a position half of the length, a part of the second pad close to the second pin is used as the pin connection portion, and a part of the second pad close to the wire is used as the wire connection portion.

In a possible implementation, in the printed circuit board provided by the embodiments of the present disclosure, a shape of the second pad is a q-shape, and a part of the q-shape corresponding to an o-shape in the q-shape is used as the pin connection portion, and a part of the q-shape corresponding to an l-shape in the q-shape is used as the wire connection portion.

In a possible implementation, in the printed circuit board provided by the embodiments of the present disclosure, a shape of the second pad is a strip shape, and an extension direction of the strip shape is parallel or substantially parallel to a direction of a connection line from the second pin to the wire.

In a possible implementation, in the printed circuit board provided by the embodiments of the present disclosure, the second pad is formed by bending a conductive wire.

In a possible implementation, in the printed circuit board provided by the embodiments of the present disclosure, the second pad is an enameled wire.

In a possible implementation, in the printed circuit board provided by the embodiments of the present disclosure, a diameter of the enameled wire is within a range of 0.15 mm to 0.25 mm.

In a possible implementation, in the printed circuit board provided by the embodiments of the present disclosure, a distance between two pins that are adjacent to each other and belong to one component is greater than a distance between the second pad and a pin adjacent to the second pad.

In a possible implementation, in the printed circuit board provided by the embodiments of the present disclosure, the solder for fixing the second pad with the wire is a lead-free solder.

In a possible implementation, in the printed circuit board provided by the embodiments of the present disclosure, the lead-free solder includes 99.3% tin by mass percentage and 0.7% copper by mass percentage.

On another hand, embodiments of the present disclosure also provide a display apparatus, including: a display panel, a flexible circuit board, and the above printed circuit board provided by the embodiments of the present disclosure. The flexible circuit board is connected between the display panel and the printed circuit board.

On another hand, embodiments of the present disclosure also provide a maintenance method for a printed circuit board, including:

cleaning a surface at a position, at which a pad is peeled off, on a base substrate of the printed circuit board to expose a wire;

placing a second pad, at the position at which the pad is peeled off, on the base substrate to cause that the second pad is in contact with the exposed wire, and fixing the second pad with the exposed wire through solder; and lapping a second pin of a component to the second pad, and fixing the second pin with the second pad through the solder.

In a possible implementation, the maintenance method provided by the embodiments of the present disclosure further includes:

forming the second pad by bending an enameled wire or a metal wire into a q-shape.

In a possible implementation, in the maintenance method provided by the embodiments of the present disclosure, the cleaning the surface at the position, at which the pad is peeled off, on the base substrate of the printed circuit board to expose the wire includes:

by using an electric soldering iron, heating the position at which the pad is peeled off and cleaning a residual solder on the base substrate; and scraping off, by using a pick-off tool, a part of an insulating layer on the base substrate to expose the wire.

BRIEF DESCRIPTION OF FIGURES

FIG. 6 is a schematic structural diagram of a display apparatus provided by embodiments of the present disclosure.

FIG. 7 is a schematic flowchart of a maintenance method for a printed circuit board provided by embodiments of the present disclosure.

DETAILED DESCRIPTION

In order to make the purpose, technical solutions and advantages of the embodiments of the present disclosure clearer, the technical solutions of the embodiments of the present disclosure will be clearly and completely described below in conjunction with the drawings of the embodiments of the present disclosure. Apparently, the described embodiments are some of the embodiments of the present disclosure, not all of them. Based on the described embodiments of the present disclosure, all other embodiments obtained by those skilled in the art without creative effort fall within the claimed scope of the present disclosure.

Unless otherwise defined, the technical terms or scientific terms used in the present disclosure shall have the usual meanings understood by those skilled in the art to which the present disclosure belongs. "First", "second" and similar words used in the present disclosure do not indicate any order, quantity or importance, but are only used to distinguish different components. "Comprising" or "including" and similar words mean that the elements or items appearing before the word include the elements or items listed after the word and their equivalents, without excluding other elements or items. Words such as "connected" or "coupled" are not limited to physical or mechanical connections, but may include electrical connections, whether direct or indirect. "Up", "down", "left", "right" and so on are only used to indicate the relative positional relationship. When the absolute position of the described object changes, the relative positional relationship may also change accordingly.

At present, for a product on which a PCB pad(s) is/are peeled off, a method of replacing the PCB is usually used in the industry. The method requires at least 6 processes, such as the PCB removal, the flexible printed circuit (FPC) removal, the anisotropic conductive film (ACF) attachment, the flexible circuit board and the glass substrate bonding (FOG Bonding), the flexible circuit board and the printed circuit board bonding (FOG Bonding), dispensing, etc., which wastes materials and a lot of manpower. Moreover, since all FPCs need to be removed when replacing the PCB, a large-size display product usually contains 8 or more FPCs, and the number of FPCs is large, the overall maintenance yield is not satisfactory.

Figure 1:
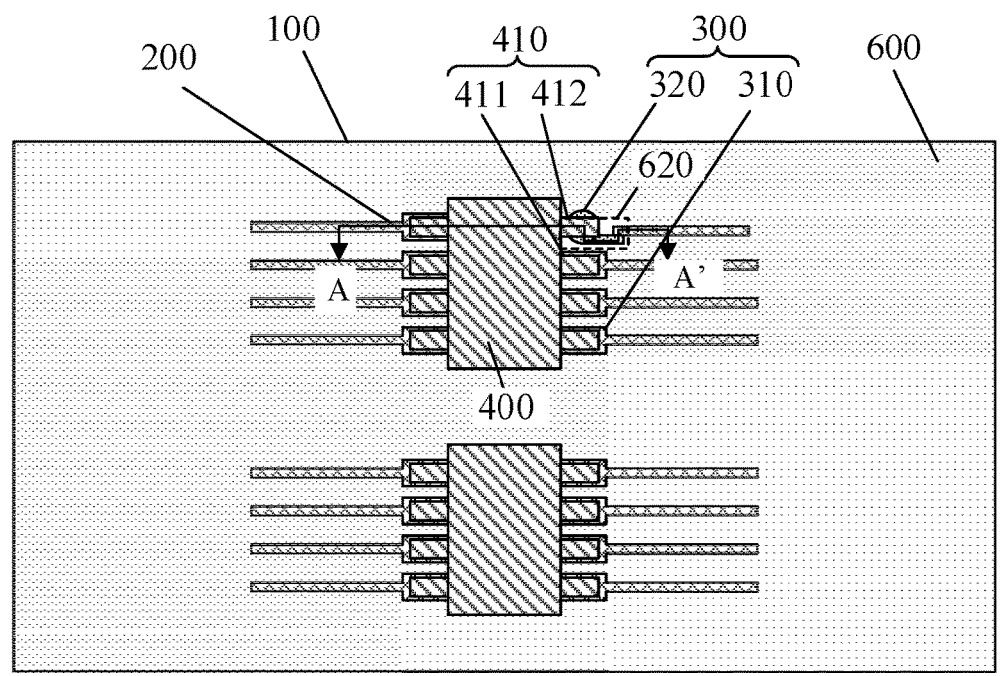
FIG. 1 is a schematic structural diagram of a top view of a printed circuit board provided by embodiments of the present disclosure.
Figure 2:
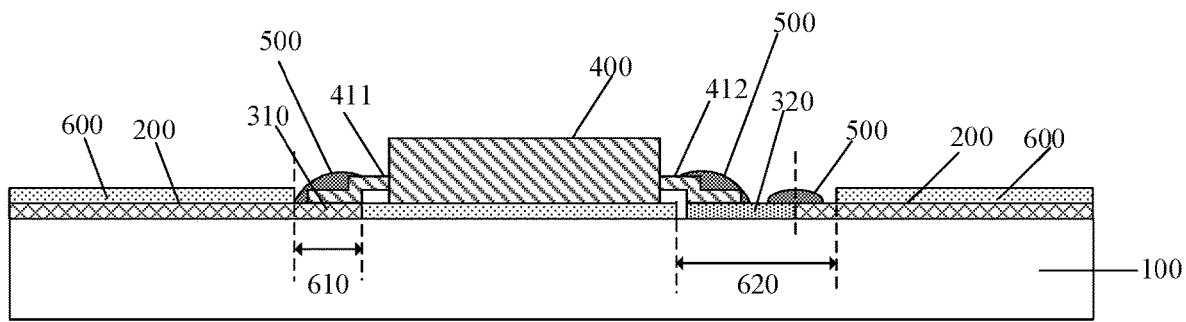
FIG. 2 is a schematic structural diagram of a sectional view along an AA' direction in FIG. 1.

Based on this, embodiments of the present disclosure provide a printed circuit board, as shown in FIG. 1 and FIG. 2, including: a base substrate 100, a plurality of wires 200 and a plurality of pads 300 located on one side of the base substrate, and at least one component 400 on one side of the pads away from the base substrate 100.

The plurality of pads 300 are correspondingly connected with the plurality of wires 200. The plurality of pads 300 include a first pad(s) 310 and a second pad(s) 320. The first pad 310 and a wire 200 connected with the first pad 310 are integrated. The second pad 320 is in contact with a wire 200 to be connected with the second pad 320 and is fixed with the wire 200 to be connected with the second pad 320 through solder 500.

The component(s) 400 include(s) pins 410. The pins 410 include a first pin(s) 411 and a second pin(s) 412. The first pin 411 is lapped with the first pad 310 and is fixed with the first pad 310 through solder 500. The second pin 412 is lapped with the second pad 320 and is fixed with the second pad 320 through solder 500.

It should be noted that the "plurality" mentioned in the embodiments of the present disclosure refers to two or more.

It should be noted that when the quantity of components 400 is 1, the first pin(s) 411 and the second pin(s) 412 are both located on this component 400. When the quantity of components 400 is 2 or more, the expression "the components 400 include pins 410, and the pins 410 include a first pin(s) 411 and a second pin 412($s$)" can be understood as that the first pin(s) 411 and the second pin(s) 412 are located on one component 400, or can also be understood as that the first pin(s) 411 and the second pin(s) 412 are respectively located on different components 400.

It should be noted that when the quantity of components 400 is 2 or more, respective components in the components 400 may be the same or different. For example, the respective components may perform the same electrical function, or perform different electrical functions.

In the printed circuit board provided by the embodiments of the present disclosure, the pad that is normally not peeled off or damaged is the first pad 310. The first pad 310 and the wire 200 connected with the first pad 310 are integrated and directly formed on the base substrate 100. When a pad 300 is peeled off at a certain position of the base substrate 100, a second pad 320 can be set at the position where the pad is peeled off to replace the pad 300 that is peeled off originally. The second pad 320 is in contact with the wire 200 to be connected with the second pad 320 and is fixed with the wire 200 to be connected with the second pad 320 through the solder, so as to replace the pad 300 that is peeled off to realize the signal transmission with the wire 200. Further, the second pin 412 of the component 400 is lapped with the second pad 320 and is fixed with the second pad 320 through the solder, so as to realize the signal transmission between the component 400 and the second pad 320. In the printed circuit board provided by the embodiments of the present disclosure, the second pad 320 is used to replace the peeled off pad 300 for maintenance, which avoids replacing the entire printed circuit board, improves the success rate of maintenance, reduces the production cost, and avoids the material waste. Moreover, the maintenance is directly performed on the printed circuit board, which can also avoid removing the printed circuit board and then performing the bonding process of the flexible circuit board and reduce the waste of manpower.

The first pad 310 and the wire 200 connected with the first pad 310 are integrated, which can be understood as that the first pad 310 and the wire 200 connected with the first pad 310 are prepared by one process (e.g., one metal deposition process). There is no obvious interface between the first pad 310 and the wire 200 connected with the first pad 310.

In some embodiments, as shown in FIG. 1 and FIG. 2, the printed circuit board further includes an insulating layer 600. The insulating layer 600 is located on one side of the wires 200 away from the base substrate 100. The printed circuit board includes a first exposed region 610. The first exposed region is not covered by the insulating layer 600. At least a partial region of each first pad 310 is located in the first exposed region 610. Preferably, an orthographic projection of the first exposed region 610 on the base substrate 100 does not overlap with an orthographic projection of the wire 200 connected with the first pad 310 on the base substrate 100, so as to ensure that the wire connected with the first pad 310 is protected by the insulating Layer 600. Further preferably, the orthographic projection of the first exposed region 610 on the base substrate 100 is located inside an orthographic projection of the first pad 310 on the base substrate 100.

In some embodiments, the material of the insulating layer 600 may be insulating varnish.

In order to keep the following description of the embodiments of the present disclosure clear and concise, in the present disclosure, detailed descriptions of known functions and known components are omitted, and only improved points are described in detail.

Optionally, in the printed circuit board provided by the embodiments of the present disclosure, as shown in FIG. 1 and FIG. 2, in general, the component 400 may include a plurality of pins 410, the pad(s) 300 corresponding to a part of the pins 410 may be peeled off, and the pad(s) 300 corresponding to the other part of the pins 410 work normally. Then, the first pin(s) 411 and the second pin(s) 412 may belong to a same one component 400.

FIG. 1 schematically shows two components 400. All the pins 410 contained in one component 400 are normal first pins 411, and after the pad 300 corresponding to one pin 410 contained in the other component 400 is peeled off, the other component 400 includes one second pin 412 and a plurality of normal first pins 411. The second pad 320 is used to connect the second pin 412 and the wire 200. Each of the first pins 411 contained in the components 400 is connected with the wire through the first pad 310 (original pad) formed on the base substrate 100.

In practical applications, there will also be a situation where the pads corresponding to all the pins 410 of a component 400 are peeled off, and then all the pins 410 of the component 400 are the second pins 412. All the pins 410 of another component 400 which are not peeled off are the first pins 411. The second pins 412 and first pins 411 are located on different components 400.

Optionally, in the printed circuit board provided by the embodiments of the present disclosure, as shown in FIG. 1, a quantity of first pins 411 included in one component 400 is greater than a quantity of second pins 412 included in this component. That is, with regard to the component 400, the occurrence of pad peeled off is rare.

Figure 3A:
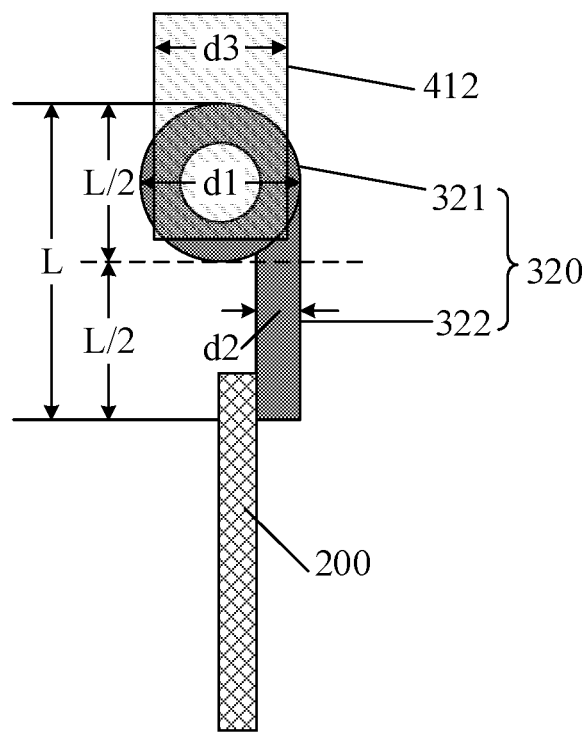
FIG. 3A is a schematic structural diagram of a second pad in a printed circuit board provided by embodiments of the present disclosure.
Figure 3B:
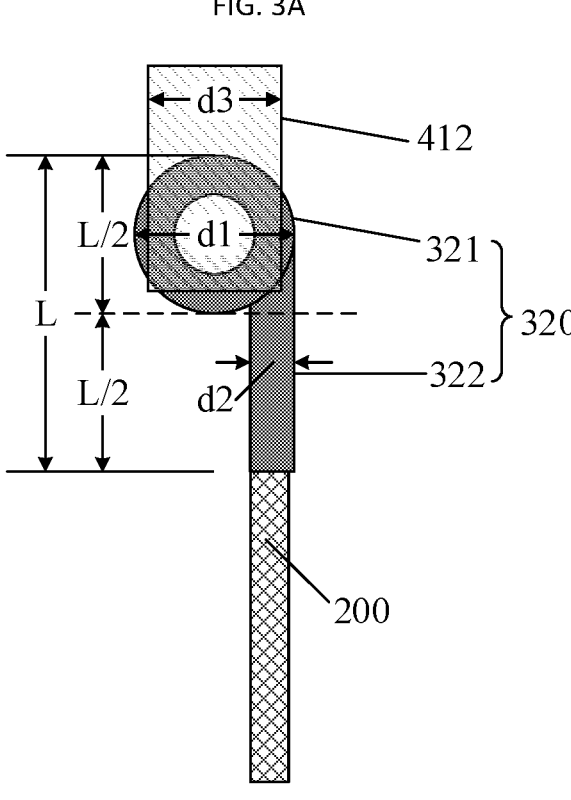
FIG. 3B is another schematic structural diagram of a second pad in a printed circuit board provided by embodiments of the present disclosure.
Figure 4:
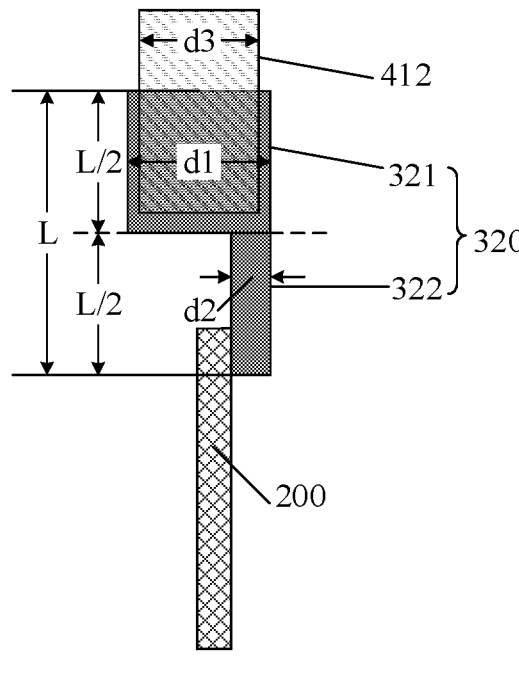
FIG. 4 is another schematic structural diagram of a second pad in a printed circuit board provided by embodiments of the present disclosure.

Optionally, in the printed circuit board provided by the embodiments of the present disclosure, as shown in FIG. 3A, FIG. 3B and FIG. 4, the second pad 320 includes a wire connection portion 322 and a pin connection portion 321 connected with each other. The wire connection portion 322 is arranged in contact with the wire 200. For example, the wire connection portion 322 may be lapped with the wire 200 (e.g., as shown in FIG. 3B, a part of the wire connection portion 322 close to the wire is located on one side of the wire 200 away from the base substrate 100), or may be only in contact with the wire 200 by a side surface, (e.g., as shown in FIG. 3A, the part of the wire connection portion 322 close to the wire and an end of the wire 200 close to the component 400 are arranged side by side). When the wire connection portion 322 is lapped with the wire 200, the overall width of the position where the wire connection portion 322 is connected with the wire 200 can be reduced, which reduces the possibility of affecting other wires after soldering. When the wire connection portion is in contact with the wire 200 by a side surface, the solder can be provided only at the side surface contact position where the wire connection portion is in contact with the wire 200 and the vicinity of the contact position, so as to reduce the amount of solder and increase the aesthetics.

The pin connection portion 321 is arranged in contact with the second pin 412. In order to ensure a firm connection between the pin and the pad, the pin connection portion 321 is generally lapped with the second pin 412. Since a width of the pin 410 of the component 400 is generally greater than the line width of the wire 200, in order to ensure that the wire connection portion 322 is effectively connected with the wire 200 without taking up too much space and ensure that the pin connection portion 321 is effectively connected with the second pin 412, an appearance of an orthographic projection of the wire connection portion 322 on the base substrate 100 is generally different from an appearance of an orthographic projection of the pin connection portion 321 on the base substrate 100. It should be noted that the different appearances here refer to different shapes and/or sizes. For example, as shown in FIG. 3A and FIG. 3B, the pin connection portion 321 can be round or circular, the wire connection portion 322 can be a strip-shape, and the shapes of the two are different. As shown in FIG. 4, both the pin connection portion 321 and the wire connection portion 322 can be the strip-shape, but the width of the pin connection portion 321 is greater than the width of the wire connection portion 322, in such a case it can be considered that the sizes of the pin connection portion 321 and the wire connection portion 322 are different. In conclusion, according to the shapes and sizes of the wire 200 and the second pin 412, the matching appearances of the pin connection portion 321 and the wire connection portion 322 can be designed.

Optionally, in the printed circuit board provided by the embodiments of the present disclosure, as shown in FIG. 3A, FIG. 3B and FIG. 4, the second pad 320 can be divided from half of the length. That is, the second pad 320 has a length L along a direction of a connection line from the second pin 412 to the wire 200. The second pad 320 is divided at the position of half of the length L/2. The part of the second pad 320 close to the second pin 412 is used as the pin connection portion 321. The part of the second pad 320 close to the wire 200 is used as the wire connection portion 322. That is, the pin connection portion 321 and the wire connection portion 322 each account for half of the length of the second pad 320. Alternatively, the proportions of lengths of the pin connection portion 321 and the wire connection portion 322 can also be designed according to the distance between breakpoint, after the pad is peeled off, of the wire 200 that actually needs to be connected and the second pin 412. For example, when the pad that is peeled off takes away more of the wire 200 to cause that the breakpoint of the wire 200 is far away from the second pin 412, the proportion of length of the wire connection portion 322 can be increased. For example, 2L/3 of the second pad 320 is used as the wire connection portion 322, and L/3 of the second pad 320 is used as the pin connection portion 321.

Optionally, in the printed circuit board provided by the embodiments of the present disclosure, as shown in FIG. 3A, FIG. 3B and FIG. 4, since a contact area between the second pin 412 and the pad 320 is generally greater than a contact area between the wire 200 and the second pad 320, an area of the orthographic projection of the pin connection portion 321 on the base substrate 100 is generally larger than an area of the orthographic projection of the wire connection portion 322 on the base substrate 100. For example, as shown in FIG. 3A and FIG. 3B, the second pad 320 can be formed by bending a conductive wire, and the area of the pin connection portion 321 can be considered as an area of a region enclosed by the outer contour of the conductive wire that is bent to form the pin connection portion 321. The area of the wire connection portion 322 can be considered as a result of multiplying a line length of a wire forming the wire connection portion 322 by a line width of the wire. As shown in FIG. 4, the second pad 320 can also be formed by a strip-shaped conductive mat. The area of the pin connection portion 321 can be considered as an area of a region enclosed by the outer contour of a part of the conductive mat that forms the pin connection portion 321. The area of the wire connection portion 322 can be considered as a result of multiplying a line length of a wire of the conductive mat forming the wire connection portion 322 by a line width of the wire.

Optionally, in the printed circuit board provided by the embodiments of the present disclosure, as shown in FIG. 3A, FIG. 3B and FIG. 4, the orthographic projection of the pin connection portion 321 on the base substrate 100 has a first width d1 in a direction perpendicular to the connection line from the second pin 412 to the wire 200. The orthographic projection of the wire connection portion 322 on the base substrate 100 has a second width d2 in the direction perpendicular to the connection line from the second pin 412 to the wire 200. The orthographic projection of the second pin 412 on the base substrate 100 has a third width d3 in the direction perpendicular to the connection line from the second pin 412 to the wire 200. The first width d1 is generally greater than the second width d2, and the first width d1 is generally greater than the third width d3. The second width d2 is designed to be smaller than the first width d1, which can make that the wire connection portion 322 is only in contact with and connected with the wire 200 where the pad is peeled off, and is not in contact with other adjacent wires 200. The first width d1 is designed to be greater than the third width d3, which can reduce the requirement for alignment accuracy of the component 400, and even if the second pin 412 has a small amount of misalignment, it can also ensure that the second pin 412 is fully lapped with the pin connection portion 321 without affecting the efficient transmission of the electrical signal. Moreover, the second width d2 is designed to be smaller, so that the overall width of the position where the wire connection portion 322 can be connected with the wire 200 can be reduced, which reduces the possibility of affecting other wires after soldering, and may reduce the amount of solder. It should be noted that the first width d1, the second width d2 and the third width d3 generally refer to the maximum widths.

Figure 5:
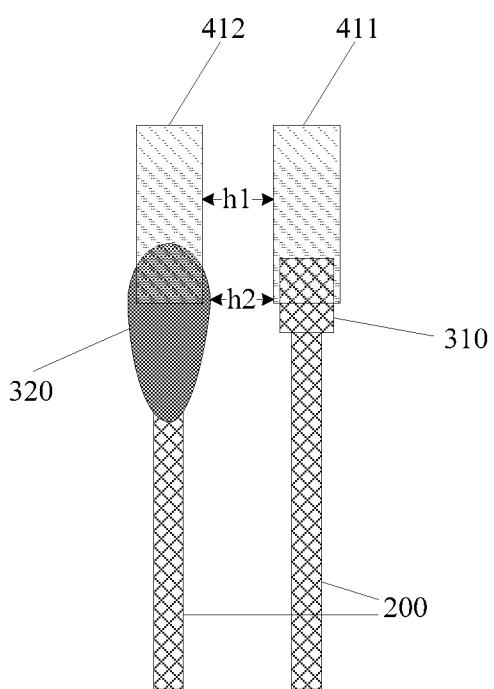
FIG. 5 is another schematic structural diagram of a second pad in a printed circuit board provided by embodiments of the present disclosure.

Optionally, in the printed circuit board provided by the embodiments of the present disclosure, as shown in FIG. 5, a distance h1 between two pins 410 that are adjacent to each other and belong to one component 400 is generally greater than a distance h2 between the second pad 320 and a pin 410 adjacent to the second pad 320, which ensures that the second pad 320 is only lapped with one pin 410, and will not be lapped with other pin(s) 410 adjacent to the second pad 320, that is, which avoids that two pins 410 are lapped with one second pad 320.

Optionally, in the printed circuit board provided by the embodiments of the present disclosure, as shown in FIG. 3A and FIG. 3B, the shape of the second pad 320 can be for example a q-shape, in which the o-shape part corresponding to the q-shape can be used as the pin connection portion 321, and the l-shape part corresponding to the q-shape can be used as the wire connection portion 322. For example, the q-shape can be formed by bending a wire, and the o-shape can be a ring or a circle, which is not limited here.

Or, optionally, in the printed circuit board provided by the embodiments of the present disclosure, as shown in FIG. 4 and FIG. 5, the shape of the second pad 320 can also be a strip shape, and the extension direction of the strip shape is roughly parallel to the direction of the connection line from the second pin 412 to the wire 200. The extension direction of the strip shape refers to the extension direction of the length of the strip shape. For example, the strip shape can be in the shape of a rectangle or an ellipse. The extension direction of the strip shape should be understood as extending along the long edge of the rectangle or the long axis of the ellipse.

It should be noted that, FIG. 3A, FIG. 3B, and FIG. 4 to FIG. 5 only schematically illustrate the shape of the second pad 320, and are not limited thereto.

Optionally, in the printed circuit board provided by the embodiments of the present disclosure, the second pad 320 may be formed by bending a conductive wire. The second pad formed by bending the conductive wire is cheap and easy to be obtained, which can greatly reduce the maintenance cost of the printed circuit board. Preferably, in the printed circuit board provided by the embodiments of the present disclosure, the second pad 320 may be an enameled wire, e.g., a polyurethane enameled wire. The polyurethane enameled wire has an excellent heat resistance and can withstand the soldering temperature during soldering. The interior of the polyurethane enameled wire is made of copper material, which has excellent electrical conductivity, can effectively reduce wire resistance, and can minimize the adverse effects of traces on signal transmission compared with other materials. Moreover, the second pad 320 may have a part exposed in the air. The pure metal wire is prone to oxidation and corrosion when exposed in the air, and the reliability is reduced. Compared with the pure metal wire, the periphery of the enameled wire can be the insulating layer composed of the enamel film, thus the second pad made of the enameled wire can effectively improve the reliability of the exposed part of the second pad. In addition, the polyurethane enameled wire has the direct solderability. For the polyurethane enameled wire coated with the enamel film, the enamel film is heated and cracked into volatile substances with the low relative molecular weight at a certain temperature, so that the enamel film is destroyed and the coil is tinned on. In this way, when the polyurethane enameled wire needs a joint(s), it is not necessary to remove the coating in advance, which simplifies the production process and effectively improves the production efficiency.

Optionally, in the printed circuit board provided by the embodiments of the present disclosure, the diameter of the conductive wire can be selected within the range of [0.15 mm, 0.25 mm]. The conductive wire with this diameter is easy to be obtained and easy to be bent, and the pin connection portion 321 formed after bending can have an appropriate size (e.g., an appropriate first width d1). Preferably, the diameter of the conductive wire is 0.2 mm. Preferably, the conductive wire is an enameled wire, and the diameter of the enameled wire is 0.2 mm.

Optionally, in the printed circuit board provided by the embodiments of the present disclosure, the solder 500 fixing the second pad 320 and the wire 200 may be the lead-free solder. In the maintenance process, the material of the solder used for fixing also determines the success or failure of the maintenance. If the lead solder with the same composition as that in the reflow soldering process is selected, toxic substances will be evaporated during soldering, which is harmful to the human body, and further the solder joints soldered by the lead-containing solder wire(s) are easily corroded and damaged. Therefore, the lead-free solder, that includes 99.3% tin by mass percentage and 0.7% copper by mass percentage and is provided with the melting point of 227° C., may be selected. The output slag of the lead-free solder after melting is less than that of ordinary solder, and the lead-free solder has the excellent anti-oxidation performance. After melting, the lead-free solder has low viscosity, good fluidity and high solderability. Due to very few oxidation inclusions, the phenomenon of sharpening can be minimized, the soldering quality is reliable, and the solder joints are bright and full, which meet GP requirements.

In some implementations, referring to FIG. 1 and FIG. 2, the printed circuit board includes a second exposed region 620. The second exposed region 620 is not covered by the insulating layer 600. At least a partial region of each second pad 320 is located in the second exposed region 620. One end of the wire 200 connected with the second pad 320 is located in the second exposed region. Preferably, the length of one end of the wire 200 connected with the second pad 320 located in the second exposed region is greater than or equal to 0.5 mm, so as to facilitate soldering of the wire 200 to the second pad 320. Further preferably, the length of one end of the wire 200 connected with the second pad 320 located in the second exposed region is greater than or equal to 1 mm.

In some embodiments, referring to FIG. 2, the area of the second exposed region 620 is larger than the area of the first exposed region 610. For example, along the extending direction of the wire 200 adjacent to the pin, the width of the second exposed region 620 is greater than the width of the first exposed region 610. For example, along the extending direction of the wire 200 adjacent to the pin, the difference between the width of the second exposed region 620 and the width of the first exposed region 610 is greater than or equal to 0.5 mm. Preferably, the difference between the width of the second exposed region 620 and the width of the first exposed region 610 is greater than or equal to 1 mm.

Based on the same inventive concept, embodiments of the present disclosure also provide a display apparatus, as shown in FIG. 6, including: a display panel 001, a flexible circuit board(s) 002, and the printed circuit board 003 provided by the embodiments of the present disclosure. The flexible circuit board 002 is connected between the display panel 001 and the printed circuit board 003.

In some embodiments, one printed circuit board 003 may be electrically connected with the display panel 001 through multiple flexible circuit boards 002. In large-sized display products, one printed circuit board 003 is usually connected with eight or more flexible circuit boards 002. Moreover, generally, two or more printed circuit boards 003 can be set in a display product. When it is found that the pad on the printed circuit board 003 has been peeled off, the second pad 320 is used to replace the pad 300 that is peeled off for maintenance, which avoids replacing the entire printed circuit board, improves the success rate of maintenance, reduces the production cost, and avoids the material waste. Moreover, the maintenance is directly performed on the printed circuit board 003, which can also avoid removing the printed circuit board 003 and then performing the bonding process of the flexible circuit board 002 and reduce the waste of manpower.

Based on the same inventive concept, embodiments of the present disclosure also provide a maintenance method for a printed circuit board, as shown in FIG. 7, which may include the following steps.

S1, cleaning a surface at a position, at which a pad is peeled off, on a base substrate of the printed circuit board to expose a wire.

S2, placing a second pad, at the position at which the pad is peeled off, on the base substrate to cause that the second pad is in contact with the exposed wire, and fixing the second pad with the exposed wire through a solder. For example, the electric soldering iron including a 0.5 C or 1 C soldering iron tip can be used to coat the lead-free solder to the connection position between the second pad and the exposed wire for soldering. The electric soldering iron used includes the 0.5 C or 1 C soldering iron tip, which can be suitable for soldering small components, or correcting the tin bridge, the tin column, etc., generated during the surface soldering.

S3, lapping a second pin of a component to the second pad, and fixing the second pin with the second pad through the solder.

Optionally, the maintenance method provided by the embodiments of the present disclosure may further includes:

forming the second pad by bending an enameled wire or a metal wire into a q-shape.

Optionally, in the maintenance method provided by the embodiments of the present disclosure, S1, cleaning a surface at a position, at which a pad is peeled off, on a base substrate of the printed circuit board to expose a wire may include:

by using the electric soldering iron, heating the position at which the pad is peeled off and cleaning a residual solder on the base substrate; and scraping off, by using a pick-off tool, a part of the insulating layer on the base substrate to expose the wire(s). This step forms the second exposed region. For example, the width of the insulating layer that is scraped off along the extending direction of the wire may be greater than or equal to 0.5 mm. Preferably, the width of the insulating layer that is scraped off along the extending direction of the wire is greater than or equal to 1 mm. For example, the insulating layer on the surface can be scraped off with a knife.

In the above maintenance method of the embodiments of the present disclosure, when the pad(s) of the printed circuit board is peeled off, the surface at the position at which the pad is peeled off can be cleaned first to expose the wire. A section of the wire is taken and the wire is bent into the second pad. Then the second pad is placed on the cross-section of the exposed wire. The solder is coated to the connection position between the second pad and the exposed wire with a heating tool for soldering and fixing. After that, the second pin of the component is fixed with the second pad through the solder. As compared with multiple operating processes with heavy process load in the prior art, the wire is used to newly create the second pad in the present application. In the prior art, when the pad of the printed circuit board is peeled off, it is required to separate the printed circuit board from the flexible circuit board(s) and separate the flexible circuit board(s) from the display panel, replace them with a new flexible circuit board(s) and a new printed circuit board, and bond the new flexible circuit board(s) to the display panel and bond the new printed circuit board to the flexible circuit board(s), which is easy to cause waste of materials, such as printed circuit board, the flexible circuit board and the anisotropic conductive adhesive, and manpower. When separating the printed circuit board from the flexible circuit board(s) and separating the flexible circuit board(s) from the display panel, there is a greater risk of fragmentation and electrode scratches leading to the scrapping problem, the quantity of flexible circuit boards to be used is large, and the overall maintenance success rate is low. The maintenance method for the printed circuit board provided by the embodiments of the present disclosure makes up for the shortcomings of the prior art, and can repair defective products, thereby improving the yield rate and reducing the production cost.

The above maintenance method provided by the embodiments of the present disclosure is described below through some embodiments, and the following steps are adopted.

Step 1, the solder, the enameled wire, the working tool (e.g., the electric soldering iron), etc. required for the work is prepared. Since the components or IC pins on the printed circuit board are very small, a 0.5 C or 1 C soldering iron tip is generally used for the maintenance work, and is suitable for soldering small components, or correcting the tin bridge, the tin column, etc., generated during the surface soldering.

Step 2, after heating the position at which the pad is peeled off with the electric soldering iron, the residual solder at this position is cleaned up, and the insulating paint on the surface is scraped off with a knife to expose the wire.

Step 3, a small section of enameled wire with a wire diameter of 0.2 mm is taken, and the enameled wire is bent into a spiral shape to form the second pad by using a tweezer. The second pad is similar in size to the pad that is peeled off, and is used to replace the pad peeled off.

Step 4, the second pad is placed on the connection position, at which the second pad is to be connected with the scraped wire, of the scraped wire, an appropriate amount of solder is coated to the connection position by the electric soldering iron for soldering, and then cooling and fixing is performed.

Step 5, the second pin of the component is soldered on the second pad.

In addition, after a printed circuit board where the pad(s) is peeled off is maintained by the above maintenance method for the printed circuit board provided by the embodiments of the present disclosure to obtain the above printed circuit board provided by the embodiments of the present disclosure, the following reliability test can also be performed on the maintained printed circuit board.

I. Electrical Evaluation of Electro-Static Discharge (ESD)
  1. Trial purpose: this trial is mainly to determine the anti-ESD performance of the maintained product.
  2. Trial steps: an ESD generator is used to bombard the maintained product, in which, contact ±8 KV, non-contact ±15 KV.
  3. Judgment criteria: the screen does not turn off and there is no abnormality during the trial.
  4. Trial results: there is no abnormality in the lighting display, and the appearance pad is not peeled off, which meets the quality requirements.

II. High Temperature Running Test
  1. Trial purpose: this trial is mainly to determine the performance of the maintained product in a high temperature environment.
  2. Trial steps: the maintained product is placed in a verification furnace at 60° C., and whether the function is normal is checked after 240 hours of operation.
  3. Judgment criteria: there is no abnormality in the lighting display, and the appearance pad is not peeled off.
  4. Trial results: there is no abnormality in the lighting display, and the appearance pad is not peeled off, which meets the quality requirements.

III. High Humidity Storage Test
  1. Trial purpose: this trial is mainly to determine the performance of the maintained product after it is stored in a high-humidity environment.
  2. Trial steps: the maintained product is placed in a verification furnace at 60° C. and 90% humidity for 240 hours to check whether the function is normal.
  3. Judgment criteria: there is no abnormality in the lighting display, and the appearance pad is not peeled off.
  4. Trial results: there is no abnormality in the lighting display, and the appearance pad is not peeled off, which meets the quality requirements.

IV. High Temperature and High Humidity Storage Test

1. Trial purpose: this trial is mainly to determine the performance of the maintained product after it is stored in a high-temperature and high-humidity environment.

2. Trial steps: the maintained product is placed in a verification furnace at 85° C. and 85% humidity for 240 hours to check whether the function is normal.

3. Judgment criteria: there is no abnormality in the lighting display, and the appearance pad is not peeled off.

4. Trial results: there is no abnormality in the lighting display, and the appearance pad is not peeled off, which meets the quality requirements.

V. Thermal Shock Test

1. Trial purpose: this trial is mainly to determine the performance of the maintained product in the environment of cold and heat shock.

2. Trial steps: the maintained product is placed in a verification furnace under the condition of −40° C. to 100° C., per 30 min, and 100 Cycle, and then whether the function is normal is checked.

3. Judgment criteria: there is no abnormality in the lighting display, and the appearance pad is not peeled off.

4. Trial results: there is no abnormality in the lighting display, and the appearance pad is not peeled off, which meets the quality requirements.

VI. Mechanical Vibration Test

1. Trial purpose: this trial is mainly to simulate the anti-vibration performance of the maintained product in the transportation environment.

2. Trial steps: the maintained product is placed in a verification apparatus, under the condition of 1 to 200 Hz, 0.82 G, and X/Y/Z directions each for 1 hour, and then whether the function is normal is checked.

3. Judgment criteria: there is no abnormality in the lighting display, and the appearance pad is not peeled off.

4. Trial results: there is no abnormality in the lighting display, and the appearance pad is not peeled off, which meets the quality requirements.

While preferred embodiments of the present disclosure have been described, additional changes and modifications to these embodiments can be made by those skilled in the art once the basic inventive concept is appreciated. Therefore, it is intended that the appended claims be construed to cover the preferred embodiments as well as all changes and modifications which fall within the scope of the present disclosure.

Apparently, those skilled in the art can make various modifications and variations to the embodiments of the present disclosure without departing from the spirit and scope of the embodiments of the present disclosure. In this way, if the modifications and variations of the embodiments of the present disclosure fall within the scope of the claims of the present disclosure and equivalent technologies, the present disclosure also intends to include these modifications and variations.

What is claimed is:

1. A printed circuit board, comprising:
a base substrate;
a plurality of wires and a plurality of pads, located on one side of the base substrate, wherein the plurality of pads are correspondingly connected with the plurality of wires, the plurality of pads comprise a first pad and a second pad, the first pad and a wire connected with the first pad are integrated, and the second pad is in contact with a wire connected with the second pad and is fixed with the wire connected with the second pad through solder; and
at least one component, located on one side of the plurality of pads away from the base substrate and comprising pins, wherein the pins comprise a first pin and a second pin, the first pin is lapped with the first pad and is fixed with the first pad through solder, and the second pin is lapped with the second pad and is fixed with the second pad through solder.

2. The printed circuit board according to claim 1, wherein the first pin and the second pin belong to one component.

3. The printed circuit board according to claim 2, wherein the component comprises a plurality of pins, and a quantity of first pins comprised in one component is greater than a quantity of second pins comprised in the one component.

4. The printed circuit board according to claim 1, wherein the second pad comprises a wire connection portion and a pin connection portion connected with each other, the wire connection portion is arranged in contact with the wire connected with the second pad, the pin connection portion is arranged in contact with the second pin, and an appearance of an orthographic projection of the wire connection portion on the base substrate is different from an appearance of an orthographic projection of the pin connection portion on the base substrate.

5. The printed circuit board according to claim 4, wherein an area of the orthographic projection of the pin connection portion on the base substrate is larger than an area of the orthographic projection of the wire connection portion on the base substrate.

6. The printed circuit board according to claim 4, wherein the orthographic projection of the pin connection portion on the base substrate has a first width in a direction perpendicular to a connection line from the second pin to the wire connected with the second pad, the orthographic projection of the wire connection portion on the base substrate has a second width in the direct perpendicular to the connection line from the second pin to the wire connected with the second pad, and an orthographic projection of the second pin on the base substrate has a third width in the direction perpendicular to the connection line from the second pin to the wire connected with the second pad; and
the first width is greater than the second width, and the first width is greater than the third width.

7. The printed circuit board according to claim 4, wherein the second pad has a length in a direction of a connection line from the second pin to the wire connected with the second pad, the second pad is divided at a position half of the length, a part of the second pad close to the second pin is used as the pin connection portion, and a part of the second pad close to the wire connected with the second pad is used as the wire connection portion.

8. The printed circuit board according to claim 4, wherein a shape of the second pad is a q-shape, and a part of the q-shape corresponding to an o-shape in the q-shape is used as the pin connection portion, and a part of the q-shape corresponding to an I-shape in the q-shape is used as the wire connection portion.

9. The printed circuit board according to claim 1, wherein a shape of the second pad is a strip shape, and an extension direction of the strip shape is parallel or substantially parallel to a direction of a connection line from the second pin to the wire connected with the second pad.

10. The printed circuit board according to claim 1, wherein the second pad is formed by bending a conductive wire.

11. The printed circuit board according to claim 1, wherein the second pad is an enameled wire.

12. The printed circuit board according to claim 11, wherein a diameter of the enameled wire is within a range of 0.15 mm to 0.25 mm.

13. The printed circuit board according to claim 1, wherein a distance between two pins that are adjacent to each other and belong to one component is greater than a distance between the second pad and a pin adjacent to the second pad.

14. The printed circuit board according to claim 1, wherein the solder for fixing the second pad with the wire connected with the second pad is lead-free solder.

15. The printed circuit board according to claim 14, wherein the lead-free solder comprises 99.3% tin by mass percentage and 0.7% copper by mass percentage.

16. A display apparatus, comprising: a display panel, a flexible circuit board, and the printed circuit board according to claim 1; wherein the flexible circuit board is connected between the display panel and the printed circuit board.

17. A maintenance method for the printed circuit board according to claim 1, comprising:

cleaning a surface at a position, at which a pad is peeled off, on the base substrate of the printed circuit board to expose a wire;

placing a second pad, at the position at which the pad is peeled off, on the base substrate to cause that the second pad is in contact with the exposed wire, and fixing the second pad with the exposed wire through solder; and lapping a second pin of a component to the second pad, and fixing the second pin with the second pad through the solder.

18. The maintenance method according to claim 17, further comprising:

forming the second pad by bending an enameled wire or a metal wire into a q-shape.

19. The maintenance method according to claim 17, wherein said cleaning the surface at the position, at which the pad is peeled off, on the base substrate of the printed circuit board to expose the wire comprises:

by using an electric soldering iron, heating the position at which the pad is peeled off and cleaning a residual solder on the base substrate; and scraping off, by using a pick-off tool, a part of an insulating layer on the base substrate to expose the wire.

\* \* \* \* \*